United States Patent
Hu (10) Patent No.: US 8,155,261 B2
(45) Date of Patent: Apr. 10, 2012

(54) SHIFT REGISTER AND GATE DRIVER THEREFOR

(75) Inventor: Ming Hu, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 386 days.

(21) Appl. No.: 12/480,914

(22) Filed: Jun. 9, 2009

(65) Prior Publication Data

US 2009/0303211 A1    Dec. 10, 2009

(30) Foreign Application Priority Data

Jun. 10, 2008 (CN) .......................... 2008 1 0114613

(51) Int. Cl.
*G11C 19/00* (2006.01)
(52) U.S. Cl. ................. 377/64; 377/69; 377/78; 377/79
(58) Field of Classification Search .................... 377/64, 377/68, 69, 71, 74, 77–80
See application file for complete search history.

(56) References Cited

U.S. PATENT DOCUMENTS

| | | | | |
|---|---|---|---|---|
| 6,052,426 A | * | 4/2000 | Maurice | ........................... 377/78 |
| 6,064,713 A | * | 5/2000 | Lebrun et al. | .................... 377/67 |
| 2009/0122951 A1 | * | 5/2009 | Tobita | .............................. 377/68 |
| 2010/0026669 A1 | * | 2/2010 | Lee et al. | ....................... 345/204 |
| 2010/0245337 A1 | * | 9/2010 | Hu et al. | ........................ 345/213 |
| 2011/0122988 A1 | * | 5/2011 | Miyayama et al. | ............. 377/64 |

* cited by examiner

*Primary Examiner* — Tuan T Lam
(74) *Attorney, Agent, or Firm* — Ladas & Parry LLP (57) ABSTRACT

The present invention relates to a shift register and a gate driver therefor. The shift register comprises: a first thin film transistor, of which a gate is connected to a first node, a source is connected to a clock signal terminal, and a drain is connected to an output terminal at current stage; a second thin film transistor, of which a gate is connected to a second node, a source is connected to the output terminal at current stage, and a drain is connected to a low level signal terminal; a third thin film transistor, of which a gate is connected to the first node, a source is connected to the low level signal terminal, and a drain is connected to the second node; a fourth thin film transistor, of which a gate is connected to the second node, a source is connected to the low level signal terminal, and a drain is connected to the first node; a first capacitor connected between the clock signal terminal and the second node; a discharging module connected between the clock signal terminal and the output terminal at current stage; a compensation module connected between the first node and the low level signal terminal. The present invention has the advantages of low cost, low power consumption and long life span etc, as well as the features of high stability, strong anti-interference capability and small delay etc.

14 Claims, 8 Drawing Sheets

SHIFT REGISTER AND GATE DRIVER THEREFOR

FIELD OF THE INVENTION

The present invention relates to a driver for liquid crystal display, and to a shift register and a gate driver therefor.

DESCRIPTION OF THE PRIOR ART

Liquid crystal display (LCD) has advantages of light weight, low thinness and low power consumption and the like, and is widely used in the devices such as mobile phone, display and TV. In a liquid crystal display, electric field is used to control liquid crystal to deflect, so as to control the light transmission to form picture to be displayed. The liquid crystal display is mainly composed of the pixel matrix arranged in both of horizontal and vertical directions. The horizontal portion of the pixel array comprises gate lines, and driving signals for the gate lines is provided by shift registers. The vertical portion of the pixel array comprises data lines which are used to apply data signal to pixel array. Different voltages are applied to pixel electrode and common electrode in the pixel matrix, so as to form a desired electric field. In a certain period, a plurality of shift registers sequentially strobe each of the gate lines from the first row to the last row, and data signals are applied to pixel electrodes of respective gate lines via data lines, so that the storage capacitor on the gate line is charged to a corresponding voltage value which is further maintained until the next scanning.

Figure 8:
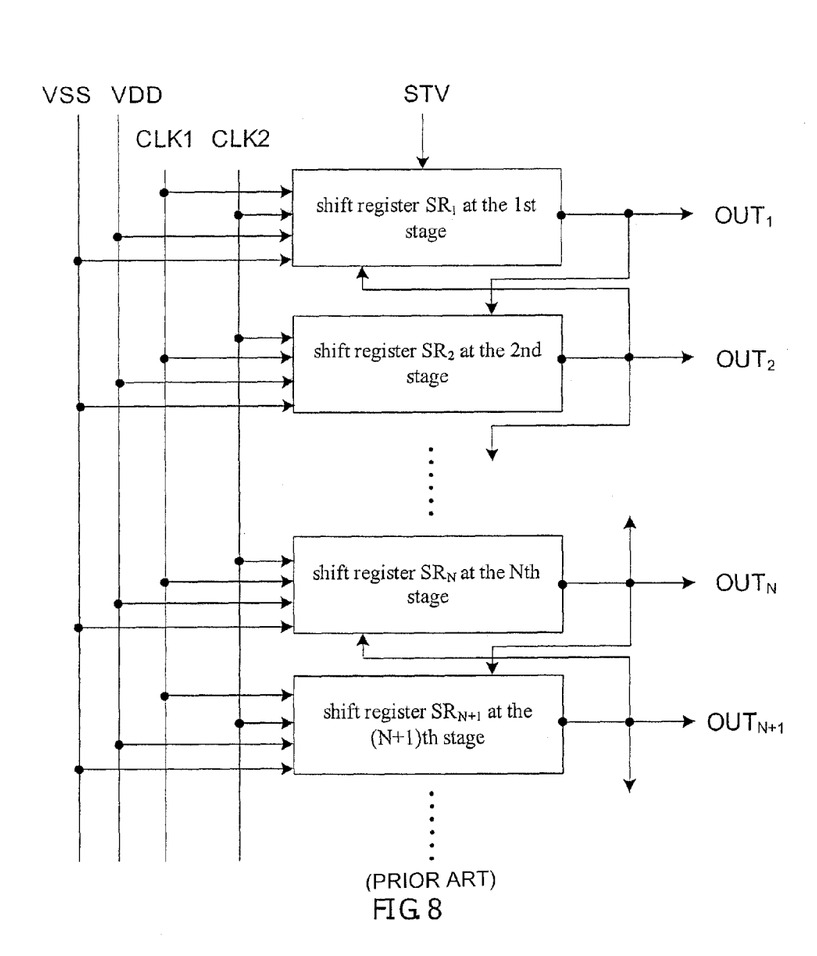
FIG. 8 is a structural schematic diagram of the gate driver according to the prior art.

FIG. 8 is a structural schematic diagram of a gate driver according to the prior art. As shown in FIG. 8, the gate driver according to the prior art comprises a multiple stages of serially connected shift registers $SR_1$, $SR_2$ ..., $SR_N$, $SR_{N+1}$, and each of which is respectively connected to a first clock signal terminal CLK1, a second clock signal terminal CLK2, a direct current signal terminal VDD and a low level signal terminal VSS. The output terminal of shift register at each stage is respectively connected to the gate line in the liquid crystal display. For example, the output terminal $OUT_1$ of shift register $SR_1$ at the first stage is connected to a first gate line in the liquid crystal display, and the output terminal $OUT_2$ of shift register $SR_2$ at the second stage is connected to a second gate line in the liquid crystal display and the like. Each of the shift registers is responsible for generating a gate driving signal which sequentially strobes a corresponding gate line. In addition, the shift register $SR_1$ at the first stage is also connected to a shift-start signal STV for receiving start signal, and the output terminals of other shift registers are simultaneously connected to the shift registers at two adjacent stages. For example, the output signal transmitted from the shift register $SR_N$ at the Nth stage to the shift register at the previous stage is used as a reset signal for the shift register $SR_{N-1}$ at the (N−1)th stage, and the output signal transmitted from the shift register $SR_N$ at the Nth stage to the shift register at the next stage is used as a start signal for the shift register $SR_{N+1}$ at the (N+1)th stage.

Figure 9:
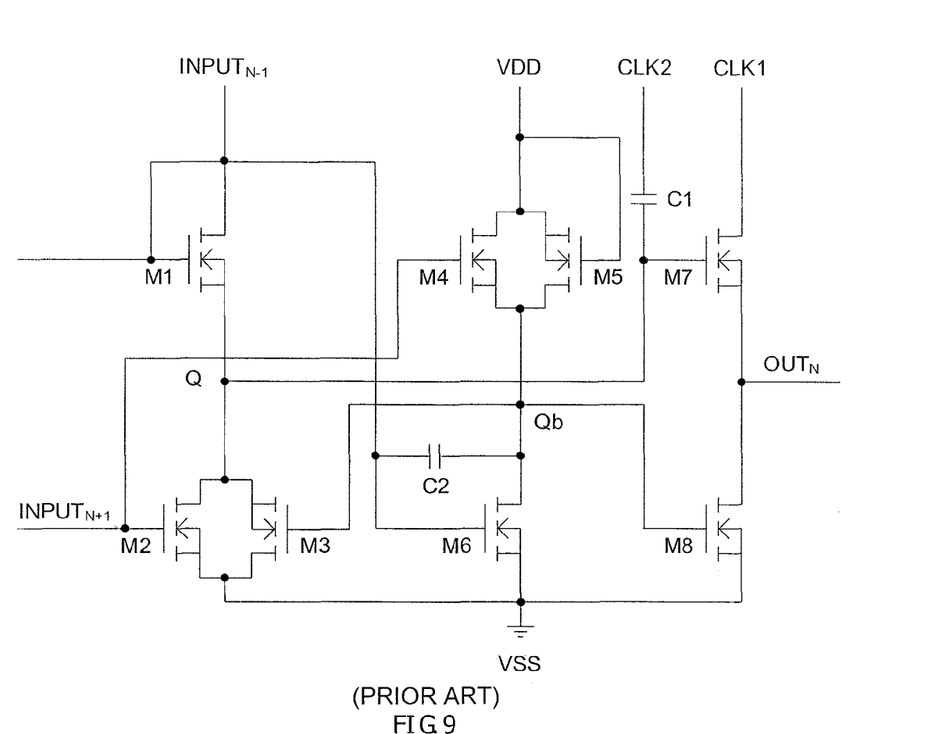
FIG. 9 is a structural schematic diagram of a shift register according to the prior art.
Figure 10:
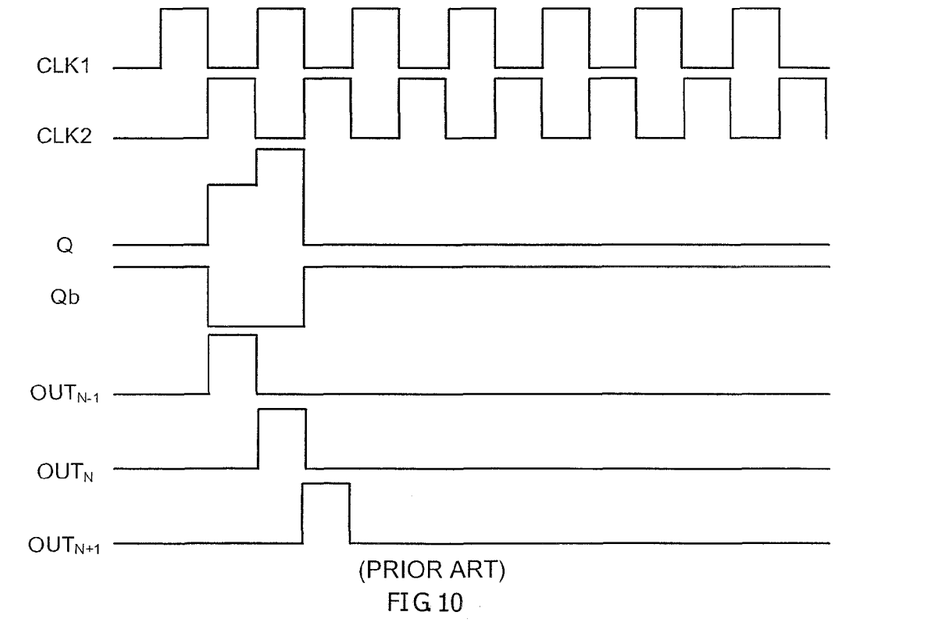
FIG. 10 is a timing chart for the operation of the shift register according to the prior art.

FIG. 9 is a structural schematic diagram of the shift register according to the prior art, and FIG. 10 is a timing chart for the operation of the shift register according to the prior art. As shown in the FIGS. 9 and 10, the I/O terminals of the shift register according to the prior art which comprise eight thin film transistors and two capacitors respectively include: a first clock signal terminal CLK1; a second clock signal terminal CLK2 (the second clock signal is an inverse signal of the first clock signal); a direct current signal terminal VDD; a low level signal terminal VSS; an input terminal $INPUT_{N-1}$ for shift register at previous stage, for receiving an output signal as a start-signal, from the shift register at the previous stage; the input terminal $INPUT_{N+1}$ for shift register at next stage, for receiving an output signal as a reset-signal, from the shift register at the next stage; and an output terminal $OUT_N$ at current stage, for outputting a gate driving signal to gate lines. In operation of the above structure according to the prior art, if the first node Q is at high level and the second node Qb is at low level, the first node Q at the high level turns on the seventh thin film transistor M7, and the second node Qb at the low level turns off the eighth thin film transistor M8, thereby the first clock signal terminal CLK1 output from the output terminal $OUT_N$ at current stage via the seventh thin film transistor M7. On the contrary, if the first node Q is at low level and the second node Qb is at high level, the first node Q at the low level turns off the seventh thin film transistor M7, and the second node Qb at the high level turns on the eighth thin film transistor M8, thus the output terminal $OUT_N$ at current stage which is connected to low level signal terminal VSS is at low level, and even if the first clock signal terminal CLK1 is at high level, it cannot be output. As can be seen from FIG. 10, when the liquid crystal display is in operation, since each of the gate lines is in unstrobed state in most time, that is, output terminal $OUT_N$ at current stage should be controlled at low level in most time, therefore, the second node Qb should be maintained at high level state in most of cases. However, research result shows that the threshold voltage of thin film transistor is gradually increased as the period during which the high level is applied is increased, and the threshold voltage of the thin film transistor will be increased when high voltage has been continuously applied to the gate of thin film transistor for a long time. However, the increase of the threshold voltage will cause the mobility of thin film transistor to be gradually deteriorated, which not only shortens the life span of thin film transistor, but also raises a problem of unstable operation and affects the normal operation of the driver.

In addition, in the prior art, the output of the shift register at current stage is also the input of shift register at next stage. Since a certain delay occurs when the shift register drives gate lines, and the accumulation of this delay on several gate lines will affect the normal operation for the shift registers, especially when the number of shift registers is large, the comparable large delay will cause the shift register at next several stages to subject to R/W errors.

DESCRIPTION OF THE INVENTION

The present invention provides a shift register and a gate driver therefor which can effectively solve the technical defects of unstable operation and short life span of thin film transistor resulted from high voltage being continuously applied to the gate of the thin film transistor for a long time.

The present invention provides a shift register, comprising:
a first thin film transistor, of which a gate is connected to a first node that serves as a pull-up node, a source is connected to a clock signal terminal, and a drain is connected to an output terminal at current stage;
a second thin film transistor, of which a gate is connected to a second node that serves as a pull-down node, a source is connected to the output terminal at current stage, and a drain is connected to a low level signal terminal;
a third thin film transistor, of which a gate is connected to the first node, a source is connected to the low level signal terminal, and a drain is connected to the second node;
a fourth thin film transistor, of which a gate is connected to the second node, a source is connected to low level signal terminal, and a drain is connected to the first node;

a first capacitor connected between the clock signal terminal and the second node, for changing the second node into high level when the clock signal terminal is at high level;

a discharging module connected between the clock signal terminal and the output terminal at current stage, for causing the output terminal at current stage to discharge to the clock signal terminal when the output terminal at current stage, is at high level and the clock signal terminal is at low level;

a compensation module connected between the first node and the low level signal terminal, for providing compensation and compensation protection for the first node, so as to change the second node into high level or low level correspondingly, according to the high level or low level of the clock signal.

Wherein said discharging module is a thin film transistor of which a gate and a source are both connected to the output terminal at current stage, and a drain is connected to the clock signal terminal.

In the above technical solution, said compensation module comprises:

a sixth thin film transistor, of which a gate is connected to an input terminal for a shift register at third previous stage, a source is connected to another clock signal terminal, and a drain is connected to the first node;

a seventh thin film transistor, of which a gate is connected to said another clock signal terminal, a source is connected to one terminal of a second capacitor, and a drain is connected to low level signal terminal, while the other terminal of the second capacitor is connected to the first node;

an eighth thin film transistor, of which a gate and a source are both connected to an input terminal for a shift register at previous stage and a drain is connected to the source of the seventh thin film transistor;

a ninth thin film transistor, of which a gate is connected to a still another CK, a drain is connected to the first node;

a tenth thin film transistor, of which a gate is connected to the first node, a drain is connected to the output terminal at current stage, and a source is connected to the source of the ninth thin film transistor;

an eleventh thin film transistor, of which a gate is connected to one terminal of a third capacitor, a drain is connected to the first node, and a drain is connected to low level signal terminal, while the other terminal of the third capacitor is connected to said another clock signal terminal;

a twelfth thin film transistor, of which a gate is connected to the input terminal for a shift register at third previous stage, a drain is connected to the gate of the eleventh thin film transistor, and a source is connected to low level signal terminal.

In the above technical solution, said compensation module comprises:

a thirteenth thin film transistor, of which a gate is connected to another clock signal terminal, a source is connected to an input terminal for a shift register at previous stage, and a drain is connected to the first node;

a fourteenth thin film transistor, of which a gate is connected to an input terminal for a shift register at next stage, a source is connected to the first node, and the drain is connected to low level signal terminal;

a fifteenth thin film transistor, of which a gate is connected to the first node, a source is connected to said clock signal terminal, and a drain serves as a control out terminal at current stage which respectively transmits output signal to shift registers at previous stage and at next stage;

a fourth capacitor connected between the gate and the source of the first thin film transistor.

The present invention also provides a gate driver which includes a plurality of shift registers connected in series, wherein said shift register has: three clock signal terminals; an output terminal at current stage; an input terminal for shift register at previous stage, for receiving an output signal from the shift register at previous stage; and an input terminal for shift register at a third previous stage, for receiving an output signal from the shift register at third previous stage.

The present invention also provides another gate driver which includes a plurality of shift registers connected in series, wherein said shift register has: two clock signal terminals; an output terminal at current stage; a control output terminal at the current stage; an input terminal for shift register at previous stage, for receiving an output signal from the shift register at previous stage; an input terminal for shift register at next stage, for receiving an output signal from the shift register at next stage; wherein said output terminal at current stage outputs a gate driving signal so as to drive the respective gate lines for liquid crystal display, and said control output terminal at the current stage outputs a control signal to the shift register at previous stage and the shift register at next stage.

The present invention provides a shift register and a gate driver thereof which have the features as follows:

(1) Instead of a direct current power supply, only a clock signal is employed to drive the thin film transistor, thus the power consumption can be greatly reduced;

(2) The period during which the second node is at high level is reduced; in particularly, the period during which the second node serving as a pull-down node is at high level is reduced to a quarter or a half of its original period, that is, the period during which the high voltage is applied to the gate of the second thin film transistor is reduced, thus the bias of threshold voltage of the second thin film transistor is reduced;

(3) Two thin film transistors are employed to cooperatively maintain the low level of the output terminal at current stage, which can greatly reduce the operation time of thin film transistor and further reduce the drifting of the threshold voltage of the second thin film transistor. The duty ratio of the bias voltage for the gate of thin film transistor is about 25% or 50%, and when the duty ratio of the bias voltage for the gate of thin film transistor is small, the threshold voltage thereof can be recovered slowly and will not be increased with the elapse of period during which high level is applied. Therefore, the damage to thin film transistor is mitigated, and the life span of thin film transistor is extended;

(4) With respect to the voltage of the second node, instead of direct current driving manner, capacitor driving manner is employed, in which clock signals and capacitors are used to drive the voltage of the second node, thereby, only electric charge driving exists in the thin film transistor. Using electric charge to turn on thin film transistor can not only decrease the power consumption, but also reduce the damage to thin film transistor;

(5) A discharging module configured with thin film transistor is employed, and thin film transistor will be put into operation only when the output terminal at current stage is at high level and the clock signal terminal is at low level. Thus the characteristic of thin film transistor can be well maintained, and the life span of thin film transistor can be greatly extended.

(6) a compensation module is used to compensate for the drifting of threshold voltage of the thin film transistor which is caused by gate biasing, thus the normal operation thereof will not be affected even if a certain drifting exists in the threshold voltage of thin film transistor, and the life span thereof is extended; in addition, two thin film transistors is used to form a discharging loop and the threshold voltage of the first thin film transistor is stored, thus it can be guaranteed that the first thin film transistor can be properly operated.

(7) With two output terminals at current stage disposed, one of which is responsible for outputting a gate driving signal so as to drive a corresponding gate line in the liquid crystal display, and the other of which employs a separate thin film transistor and is responsible for outputting an output signal as a reset signal of the shift register at previous stage to the shift register at previous stage and outputting an output signal as an initial signal of the shift register at next stage to the shift register at next stage, the defects that one output terminal will cause R/W errors of the shift registers at next stages due to delay can be avoided, thus the operation stability is improved.

To sum up, the present invention has the advantages of low cost, low power consumption and long life span etc, as well as the features of high stability, strong anti-interference capability and small delay etc.

The technical solution according to embodiments of the present invention will be further described in details below with reference to the drawings and the embodiments.

DETAILED DESCRIPTION OF A PREFERRED EMBODIMENT OF THE INVENTION

Figure 1:
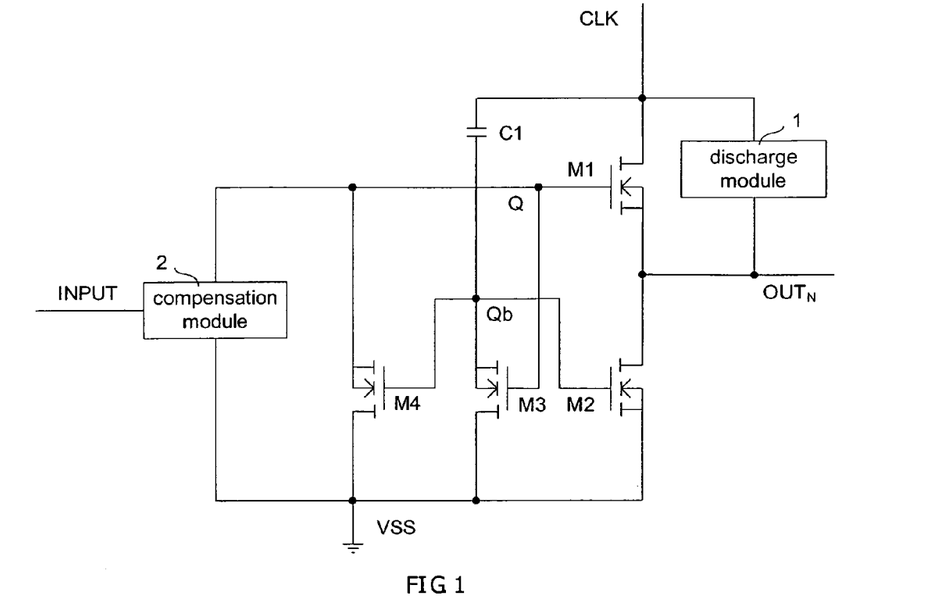
FIG. 1 is a structural schematic diagram of a shift register according to an embodiment of the present invention.

FIG. 1 is a structural schematic diagram of a shift register according to an embodiment of the present invention. As shown in FIG. 1, the main part of shift register according to an embodiment of the present invention comprises four thin film transistors, a storage capacitor, a compensation module and corresponding I/O terminals, and in particular comprises: a first thin film transistor M1, of which a gate is connected to a first node Q that serves as a pull-up node, a source is connected to a clock signal terminal CLK, and a drain is connected to a output terminal $OUT_N$ at current stage, for providing high level output for the output terminal $OUT_N$ at current stage; a second thin film transistor M2, of which a gate is connected to a second node Qb that serves as a pull-down node, a source is connected to the output terminal $OUT_N$ at current stage, and a drain is connected to a low level signal terminal VSS, for maintaining the output terminal $OUT_N$ at current stage at low level; a third thin film transistor M3, of which a gate is connected to the first node Q, a source is connected to low level signal terminal VSS, and a drain is connected to the second node Qb, for maintaining the second node Qb which serves as a pull-down node at low level when the first node Q which serves as a pull-up node is at high level; a fourth thin film transistor M4, of which a gate is connected to the second node Qb, a source is connected to low level signal terminal VSS, and a drain is connected to the first node Q, for maintaining the first node Q at low level when the second node Qb is at high level so as to keep the gate of the first thin film transistor M1 at low level; a discharging module 1 connected between the clock signal terminal CLK and output terminal $OUT_N$ at current stage with a function of discharging, for discharging to the clock signal terminal CLK via the discharging module 1 so as to keep the output terminal $OUT_N$ at current stage at low level when the clock signal terminal CLK is at low level and the output terminal $OUT_N$ at current stage is at high level, and for pulling down the output terminal $OUT_N$ at current stage to low level; a first capacitor C1 arranged between the clock signal terminal CLK and the second node Qb, for causing the second node Qb to be at high level via the first capacitor C1 when the clock signal terminal CLK changes to high level, so as to turn on both of the fourth thin film transistor M4 and the second thin film transistor M2 and keep the first node Q and the output terminal $OUT_N$ at current stage at low level; a compensation module 2 arranged between the first node Q and the low level signal terminal VSS and connected to the other signal input terminal INPUT, for providing compensation and compensation protection for the first node so as to correspondingly change the second node Qb to high level or low level based on whether the clock signal terminal is at high level or low level.

Figure 2:
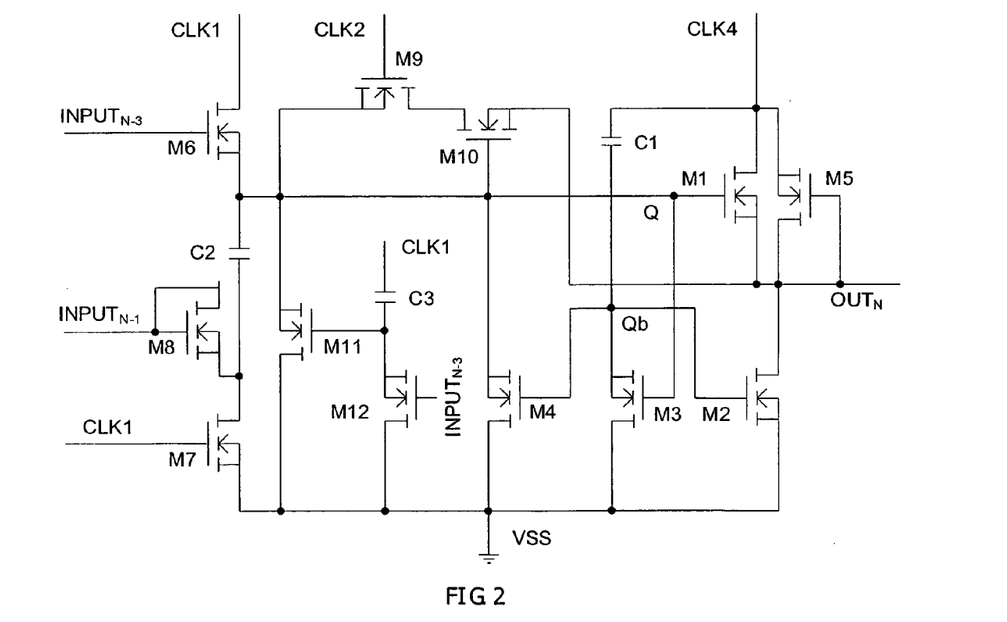
FIG. 2 is a structural schematic diagram of a shift register according to a first embodiment of present invention.

FIG. 2 is a structural schematic diagram of a shift register according to a first embodiment of present invention. The main structure of the shift register according to the present embodiment comprises: twelve Hydrogenated Amorphous Silicon thin film transistors which are a first thin film transistor M1, a second thin film transistor M2, a third thin film transistor M3, a fourth thin film transistor M4, a fifth thin film transistor M5, a sixth thin film transistor M6, a seventh thin film transistor M7, a eighth thin film transistor M8, a ninth thin film transistor M9, a tenth thin film transistor M10, an eleventh thin film transistor M11 and a twelfth thin film transistor M12, respectively; three storage capacitors which are a first capacitor C1, a second capacitor C2 and a third capacitor C3, respectively; and corresponding I/O terminals which include a low level signal terminal VSS, an output terminal $OUT_N$ at current stage, an input terminal for previous stage for receiving a signal outputted from the shift register at previous stage, an input terminal for third previous stage for receiving a signal outputted from a shift register at third previous stage; and three clock terminals which are three of a first clock signal terminal CLK1, a second clock signal terminal CLK2, a third clock signal terminal CLK3 and a fourth signal terminal CLK4 which are consecutive each other.

With regard to the shift register at an Nth stage as shown in FIG. 2, the input terminal for previous stage for receiving an output signal from a shift register at previous stage is the input terminal $INPUT_{N-1}$ for shift register at previous stage, and the input terminal for third previous stage for receiving an output terminal from a shift register at a third previous stage is the input terminal $INPUT_{N-3}$ for shift register at third previous stage. Said three clock signal terminals are the first clock signal terminal CLK1, the second clock signal terminal CLK2, and the fourth clock signal terminal CLK4 respectively. For the first thin film transistor M1, the gate thereof is connected to the first node Q that serves as a pull-up node, the source thereof is connected to the fourth clock signal terminal CLK4, and the drain thereof is connected to output terminal $OUT_N$ at current stage; for the second thin film transistor M2, the gate thereof is connected to the second node Qb that serves as a pull-down node, the source thereof is connected to the output terminal $OUT_N$ at current stage, and the drain thereof is connected to the low level signal terminal VSS; for the third thin film transistor M3, the gate thereof is connected to the first node Q, the source thereof is connected to the low level signal terminal VSS, and the drain thereof is connected to the second node Qb; for the fourth thin film transistor M4, the gate thereof is connected to the second node Qb, the source thereof is connected to the low level signal terminal VSS, and the drain thereof is connected to the first node Q; for the fifth thin film transistor M5 which serves as a discharging module, the gate and the source thereof are both connected to the output terminal $OUT_N$ at current stage, the drain thereof is connected to the fourth clock signal terminal CLK4; for the sixth thin film transistor M6, the gate thereof is connected to the input terminal $INPUT_{N-3}$ for shift register at third previous stage, the source thereof is connected to the first clock signal terminal CLK1, and the drain thereof is connected to the first node Q; for the seventh thin film transistor M7, the gate thereof is connected to the first clock signal terminal CLK1, the source thereof is connected to one terminal of the second capacitor C2, and the drain thereof is connected to the low level signal terminal VSS, while the other terminal of the second capacitor C2 is connected to the first node Q; for the eighth thin film transistor M8, the gate and the source thereof are both connected to the input terminal $INPUT_{N-1}$ for shift register at previous stage, and the drain thereof is connected to the source of the seventh thin film transistor M7; for the ninth thin film transistor M9, the gate thereof is connected to the second clock signal terminal CLK2, the source thereof is connected to the source of the tenth thin film transistor M10, and the drain thereof is connected to the first node Q; for the tenth thin film transistor M10, the gate thereof is connected to the first node Q, the drain thereof is connected to the output terminal $OUT_N$ at current stage, and the source thereof is connected to the source of the ninth thin film transistor M9; for the eleventh thin film transistor M11, the gate thereof is connected to one terminal of the third capacitor C3, the drain thereof is connected to the first node Q, and the source thereof is connected to the low level signal terminal VSS, while the other terminal of the third capacitor C3 is connected to the first clock signal terminal CLK1; for the twelfth thin film transistor M12, the gate thereof is connected to the input terminal $INPUT_{N-3}$ for shift register at third previous stage, the drain thereof is connected to the gate of the eleventh thin film transistor M11, and the source thereof is connected to the low level signal terminal VSS; the first capacitor C1 is arranged between the fourth clock signal terminal CLK4 and the second node Qb; the second capacitor C2 is arranged between the first node Q and the drain of the eighth thin film transistor M8; and the third capacitor C3 is arranged between the first clock signal terminal CLK1 and the gate of the eleventh thin film transistor M11. Wherein, the fifth thin film transistor M5 is used as the discharging module in the present embodiment, whereas the compensation module in the present embodiment is composed of the sixth thin film transistor M6, the seventh thin film transistor M7, the eighth thin film transistor M8, the ninth thin film transistor M9, the tenth thin film transistor M10, the eleventh thin film transistor M11, the twelfth thin film transistor M12, the second capacitor C2 and the third capacitor C3. Practically, the above technical solution according to the present embodiment is not only applicable to the Hydrogenated Amorphous Silicon thin film transistor, but also applicable to the other thin film transistor.

Figure 3:
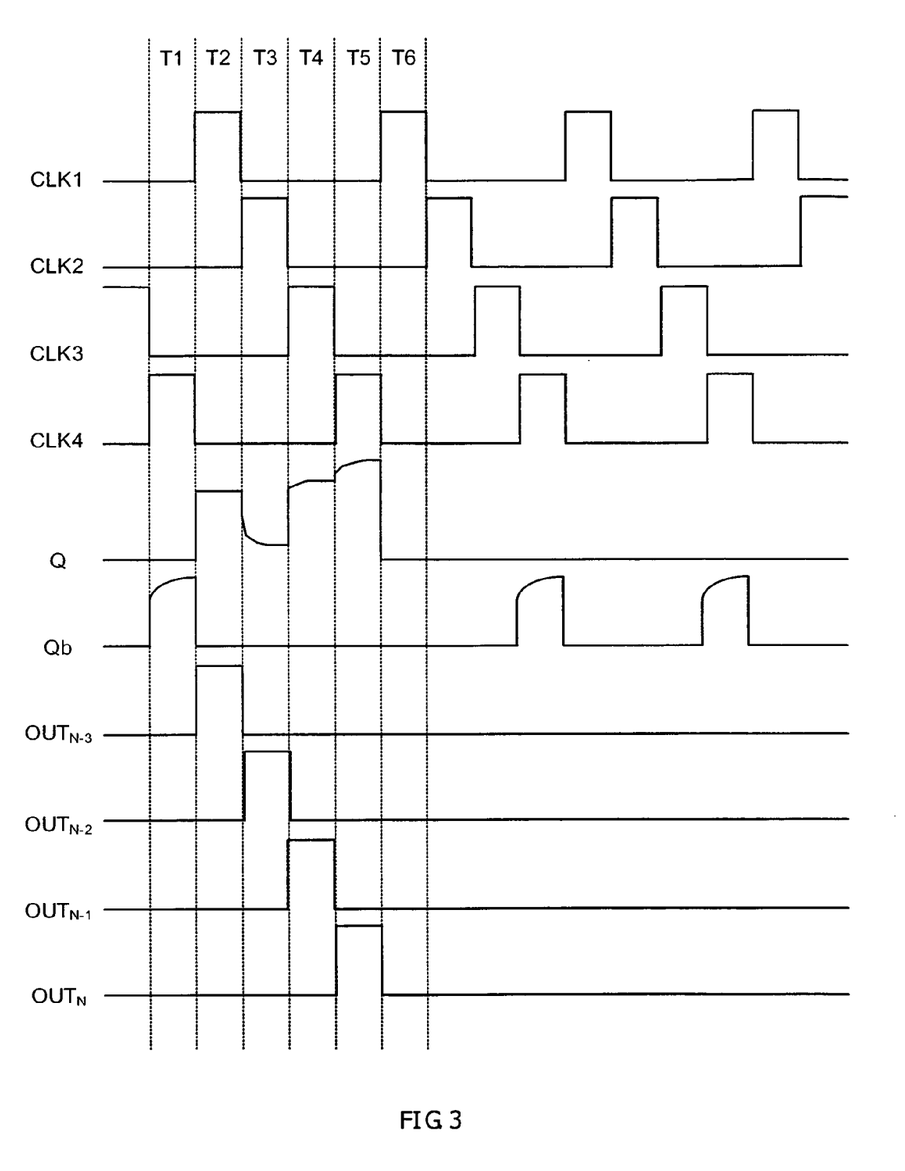
FIG. 3 is a timing chart for the operation of the shift register according to the first embodiment of the present invention.

FIG. 3 is a timing chart for the operation of the shift register according to the first embodiment of the present invention. The technical solution of the present embodiment will be further explained for the operation of the shift register with reference to FIGS. 2 and 3.

The operation of the shift register according to the present embodiment is divided into six phases, and the details of the operation for each phase are as follows:

The First Phase T1

In this phase, the fourth clock signal terminal CLK4 is at high level, and all of the other clock signal terminals are at low level. Via the first capacitor C1, the fourth clock signal terminal CLK4 changes the second node Qb which serves as a pull-down node to high level, thus the second thin film transistor M2 and the fourth thin film transistor M4 is in ON state, which allows the first node Q serving as a pull-up node as well as the output terminal $OUT_N$ at current stage to be connected to the low level signal terminal VSS and maintained at low level. In this phase, all of the other thin film transistors are in OFF state.

The Second Phase T2

In this phase, the first clock signal terminal CLK1 is at high level, and all of the other clock signal terminals are at low level, whereas the input terminal $INPUT_{N-3}$ for shift register at third previous stage is at high level; the high level at the input terminal $INPUT_{N-3}$ for shift register at third previous stage turns on the twelfth thin film transistor M12, and the drain thereof is connected to the low level signal terminal VSS through the source thereof. Therefore, although the first clock signal terminal CLK1 is at high level at this time, the gate of the eleventh thin film transistor M11 is still at low level, thereby putting the eleventh thin film transistor M11 into OFF state; since the fourth clock signal terminal CLK4 changes to low level at this time, the second node Qb is also at low level, thereby putting the second thin film transistor M2 and the fourth thin film transistor M4 into OFF state; since input terminal $INPUT_{N-3}$ for shift register at third previous stage is at high level, the sixth thin film transistor M6 is turned on, thus the first clock signal terminal CLK1 at high level causes the first node Q to have a relatively high voltage through the sixth thin film transistor M6, and the terminal of the second capacitor C2 which is connected to the drain of the sixth thin film transistor M6 (that is, to the first node Q) also has a relatively high voltage; since the first clock signal terminal CLK1 is at high level, the seventh thin film transistor M7 is turned on, thus the terminal of the second capacitor C2 which is connected to the seventh thin film transistor M7 is at low level.

The Third Phase T3

In this phase, the second clock signal terminal CLK2 changes to high level, and all of the other clock signal terminals are at low level; the high level at the second clock signal terminal CLK2 puts the ninth thin film transistor M9 in a ON state, and since the first node Q is at high level at this time, the first thin film transistor M1 and the tenth thin film transistor M10 are in ON state. Thus, the second clock signal terminal CLK2, the ninth thin film transistor M9, the tenth thin film transistor M10, the first node Q, the first thin film transistor M1 and the fourth clock signal terminal CLK4 constitute a loop for discharging to the fourth clock signal terminal CLK4 until the voltage of the first node Q reaches the threshold voltage of the first thin film transistor M1 and the tenth thin film transistor M10, thus the tenth thin film transistor M10 stores the threshold voltage of the first thin film transistor M1, and maintains this threshold voltage.

The Fourth Phase T4

In this phase, all of the three clock signal terminals are at low level, and the input terminal $INPUT_{N-1}$ for shift register at previous stage is at high level; the input terminal $INPUT_{N-1}$ for shift register at previous stage at the high level turns on the eighth thin film transistor M8, thus the drain of the eighth thin film transistor M8 changes to high level; due to the second capacitor C2, the voltage at the first node Q, which originally is a threshold voltage, is increased by a voltage provided by the eighth thin film transistor M8, thus the first node Q is at high level; the high level at the first node Q turns on the first thin film transistor M1 and the third thin film transistor M3, therefore, the second node Qb is connected to the low level signal terminal VSS and is maintained at low level.

The Fifth Phase T5

In this phase, the fourth clock signal terminal CLK4 changes to high level, and the other clock signal terminals change to low level; in this phase, although the high level at the fourth clock signal terminal CLK4 tends to changing the second node Qb to high level via the first capacitor C1, since the first node Q is at high level at this time, the first thin film transistor M1 and the third thin film transistor M3 are in ON state, thus the second node Qb which serves as a pull-down node is connected to the low level signal terminal VSS. Therefore, the second node Qb is pulled down to a low level. The low level at the second node Qb puts the second thin film transistor M2 and the fourth thin film transistor M4 into OFF state. Thereby, via the first thin film transistor M1, the fourth clock signal terminal CLK4 is outputted and the output terminal $OUT_N$ at current stage is at high level.

The Sixth Phase T6

In this phase, the first clock signal terminal CLK1 changes to high level, and the other clock signal terminals change to low level; at this time, the output terminal $OUT_N$ at current stage the high level turns on the fifth thin film transistor M5 which serves as a discharging module, and via the fifth thin film transistor M5, output terminal $OUT_N$ at current stage discharges to the fourth clock signal terminal CLK4 at low level until the output terminal $OUT_N$ at current stage changes to low level. At the same time, since the first clock signal terminal CLK1 is at high level, the seventh thin film transistor M7 and the eleventh thin film transistor M11 are both in ON state, which allows the first node Q to be connected to the low level signal terminal VSS and maintained at low level. Then, no matter how the first clock signal terminal CLK1, the second clock signal terminal CLK2 and the fourth clock signal terminal CLK4 change, the first node Q is always kept at low level which maintains the low level at the output terminal $OUT_N$ at current stage. At the same time, via the first capacitor C1, the level of the second node Qb is consistent with the level of the fourth clock signal terminal CLK4, that is, when the fourth clock signal terminal CLK4 is at high level, the second node Qb is also at same high level, and when the fourth clock signal terminal CLK4 is at low level, the second node Qb is also at same low level, until the initial signal for the next frame arrives.

As can be seen from the operation for the shift register according to the present embodiment, in the technical solution of present embodiments, the first thin film transistor M1 is used to provide a high level output for the output terminal $OUT_N$ at current stage; the second thin film transistor M2 is used to maintain the output terminal $OUT_N$ at current stage at low level; the third thin film transistor M3 is used to maintain the second node Qb which serves as a pull-down node at low level when the first node Q which serves as a pull-up node is at high level; the fourth thin film transistor M4 is used to maintain the first node Q at low level when the second node is at high level, so that the gate of the first thin film transistor M1 is maintained at low level; the fifth thin film transistor M5 which serves as a discharging module is used to discharge, and when the fourth clock signal terminal CLK4 is at low level and output terminal $OUT_N$ at current stage is at high level, the output terminal $OUT_N$ at current stage at the high level is discharged to the fourth clock signal terminal CLK4 via the fifth thin film transistor M5, thus the output terminal $OUT_N$ at current stage is maintained at low level, also the fifth thin film transistor M5 is used to pull the output terminal $OUT_N$ at current stage down to the low level; the sixth thin film transistor M6 is mainly used to provide a compensation voltage for the first node Q when the first clock signal terminal CLK1 is at high level; the seventh thin film transistor M7 is mainly used to control, when the first clock signal terminal CLK1 provides a compensation voltage for the first node Q which serves as a pull-up node, the terminal of the second capacitor C2 which is connected to the source of the seventh thin film transistor M7 to be at low level; the eighth thin film transistor M8 is mainly used to provide a high level for the first node Q; the ninth thin film transistor M9 and the tenth thin film transistor M10 are mainly used to form a discharging loop together, so that the tenth thin film transistor M10 stores the threshold voltage of the first thin film transistor M1; the eleventh thin film transistor M11 is used to maintain the first node at low level when the first node is not operating; the twelfth thin film transistor M12 is used to put the eleventh thin film transistor into OFF state when the first clock signal terminal CLK1 provides compensation voltages; the first capacitor C1 is used to changes the second node Qb to high level when the fourth clock signal terminal CLK4 changes to high level, thus the second thin film transistor M2 and the fourth thin film transistor M4 are turned on, which maintains the first node and the output terminal $OUT_N$ at current stage at low level; the second capacitor C2 is mainly used to changes the compensated first node Q to high level, thus the first thin film transistor M1 and the third thin film transistor M3 are turned on; the third capacitor C3 is mainly used to provide a high level for the gate of eleventh thin film transistor M11 via the first clock signal terminal CLK1, thus direct current can be avoided and the power consumption can be reduced.

In the technical solution for the shift register according to the present embodiment, output terminal $OUT_N$ at current stage of the shift register outputs a gate driving signal to drive a corresponding gate line in liquid crystal display, and receives output signals from other two shift registers; wherein, one of the output signals which is from a shift register at previous stage is used as an initial signal for the shift register at current stage, while the other of the output signals which is from a shift register at the third previous stage is used as a compensation signal for the shift register at current stage. The operation of the shift register is simultaneously controlled by three clock signals, an initial signal from the shift register at previous stage and a compensation signal from a shift register at the third previous stage. The shift register according to the present embodiment does not employ a direct current power supply, and is driven only by the clock signal, thus the power consumption can be greatly reduced. The shift register according to the present embodiment may shorten the period during which the second node Qb is at high level. In particularly, the period during which the second node Qb serving as a pull-up node is at high level is reduced to be a quarter of original period, that is, the period during which the high level is applied to the gate of the second thin film transistor M2 is reduced, thus the shifting of the threshold voltage of the second thin film transistor M2 is reduced. The shift register according to the present embodiment employs the second thin film transistor M2 and the fifth thin film transistor M5 to cooperatively maintain the low level of the output terminal $OUT_N$ at current stage, thus the operation time for the second thin film transistor M2 can be greatly reduced, and the drifting of the threshold voltage of the second thin film transistor M2 can be further reduced. Wherein, the duty ratio of the bias voltage for the gate of the second thin film transistor M2 is about 25%, and when the duty ratio of the bias voltage for the gate of thin film transistor is small, the threshold voltage thereof can be recovered slowly and does not increase with the increase of the period during which high level is applied. Therefore, in this embodiment, the damage to thin film transistor is mitigated and the life span of thin film transistor is extended. Also, with respect to the voltage of the second node Qb, instead of direct current driving manner in the prior art, capacitor driving manner is employed in the present embodiment, in which the fourth clock signal terminal CLK4 and the first capacitor C1 are used to drive the voltage of the second node Qb, thereby, only electric charge driving is applied in the thin film transistor. Using electric charge to turn on thin film transistor can not only decrease the power consumption, but also reduce the damage to thin film transistor. The present embodiment also provides a discharging module configured with thin film transistor, and thin film transistor will operate only when the output terminal $OUT_N$ at current stage is at high level and the fourth clock signal terminal CLK4 is at low level. Thus the characteristic of thin film transistor can be well maintained, and the life span of thin film transistor can be greatly extended. Furthermore, the present embodiment employs a compensation module to compensate for the drifting of threshold voltage of the thin film transistor due to gate bias, thus the normal operation will not be affected even if a certain drifting exists in the threshold voltage of thin film transistor, and the life span thereof is extended. Wherein, the ninth thin film transistor M9 and the tenth thin film transistor M10 form a discharging loop and the threshold voltage of the first thin film transistor M1 is stored, thus it can be guaranteed that the first thin film transistor M1 can be properly operated. In the present embodiment, only when the output terminal $OUT_N$ at current stage output high level, would the thin film transistor be provided with a gate biasing; whereas throughout operation of the shift register, the period during which the output terminal $OUT_N$ at current stage outputs a high level is very short, thus no substantial influence is made on the drifting of the threshold voltage of thin film transistor, and it can be guaranteed that the thin film transistor can operate for a long time without being deteriorated. To sum up, the present invention has the advantages of low cost, low power consumption and long life span, as well as the features of high stability and strong anti-interference capability etc.

Figure 4:
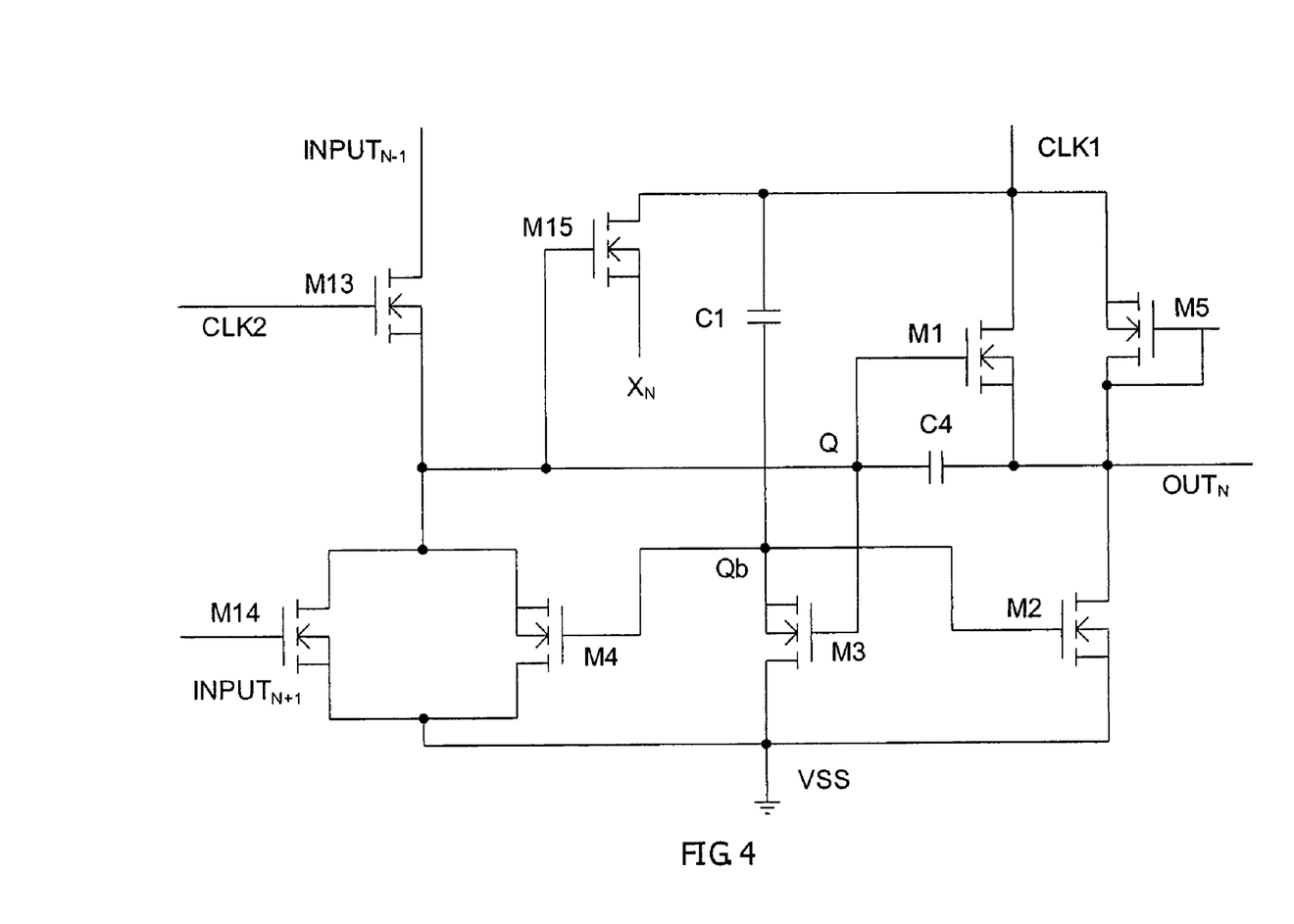
FIG. 4 is a structural schematic diagram of a shift register according to a second embodiment of present invention.

FIG. 4 is a structural schematic diagram of a shift register according to a second embodiment of present invention. The main structure of the shift register according to the present embodiment comprises eight Hydrogenated Amorphous Silicon thin film transistors, two storage capacitors and corresponding I/O terminals. Wherein, said eight Hydrogenated Amorphous Silicon thin film transistors are a first thin film transistor M1, a second thin film transistor M2, a third thin film transistor M3, a fourth thin film transistor M4, a fifth thin film transistor M5, a thirteenth thin film transistor M13, a fourteenth thin film transistor M14 and a fifteenth thin film transistor M15 respectively. Said two storage capacitors respectively include a first capacitor C1 and a fourth capacitor C4. Said corresponding I/O terminals include: a low level signal terminal VSS; an output terminal $OUT_N$ at current stage; a control output terminal $X_N$ at current stage; an input terminal for previous stage, for receiving output signal from the shift register at a previous stage; an input terminal for next stage, for receiving an output signal as a reset signal from the shift register at next stage; and two clock signal terminals, which are the first clock signal terminal CLK1 and the second clock signal terminal CLK2 that are outputted sequentially, and the second clock signal is the inverse signal of the first clock signal.

With regard to the shift register at the Nth stage as shown in FIG. 4, input terminal for previous stage for receiving output signal from a shift register at a previous stage is input terminal $INPUT_{N-1}$ for shift register at previous stage, and an input terminal for next stage for receiving output signal from a shift register at a next stage is an input terminal $INPUT_{N+1}$ for shift register at next stage. The connection structure of the first to fifth thin film transistors M1~M5 is substantially the same as that of the shift register according to the first embodiment of the present invention described above, with details as follows. For the first thin film transistor M1, the gate thereof is connected to the first node Q that serves as a pull-up node, the source thereof is connected to the first clock signal terminal CLK1, and the drain thereof is connected to the output terminal $OUT_N$ at current stage; for the second thin film transistor M2, the gate thereof is connected to the second node Qb that serves as a pull-down node, the source thereof is connected to the output terminal $OUT_N$ at current stage, and the drain thereof is connected to the low level signal terminal VSS; for the third thin film transistor M3, the gate thereof is connected to the first node Q, the source thereof is connected to the low level signal terminal VSS, and the drain thereof is connected to the second node Qb; for the fourth thin film transistor M4, the gate thereof is connected to the second node Qb, the source thereof is connected to the low level signal terminal VSS, and the drain thereof is connected to the first node Q; for the fifth thin film transistor M5 which serves as a discharging module, the gate and the source thereof are both connected to the output terminal $OUT_N$ at current stage, the drain thereof is connected to the first clock signal terminal CLK1; for the thirteenth thin film transistor M13, the gate thereof is connected to the second clock signal terminal CLK2, the source thereof is connected to the input terminal $INPUT_{N-1}$ for shift register at previous stage, and the drain thereof is connected to the first node Q; for the fourteenth thin film transistor M14, the gate thereof is connected to input terminal $INPUT_{N+1}$ for shift register at next stage, the source thereof is connected to the first node Q, and the drain thereof is connected to the low level signal terminal VSS; for the fifteenth thin film transistor M15, the gate thereof is connected to the first node Q, the source thereof is connected to the first clock signal terminal CLK1, and the drain thereof is used as control output terminal $X_N$ at current stage, which transmits an output signal as a reset signal to the source of the thirteenth thin film transistor of the shift register at the previous stage, and on the other hand, transmits an output signal as a start signal to the gate of the fourteenth thin film transistor of the shift register at the next stage. The first capacitor C1 is arranged between the first clock signal terminal CLK1 and the second node Qb, and the fourth capacitor C4 is arranged between the gate and the drain of the first thin film transistor M1 (between the first node Q and output terminal $OUT_N$ at current stage). Wherein, the fifth thin film transistor M5 is used as the discharging module in the present embodiment, whereas the compensation module in the present embodiment is composed of the thirteenth thin film transistor M13, the fourteenth thin film transistor M14, the fifteenth thin film transistor M15 and the fourth capacitor C4. Practically, the above technical solution according to the present embodiment is not only applicable to the Hydrogenated Amorphous Silicon thin film transistor, but also applicable to the other thin film transistor.

Figure 5:
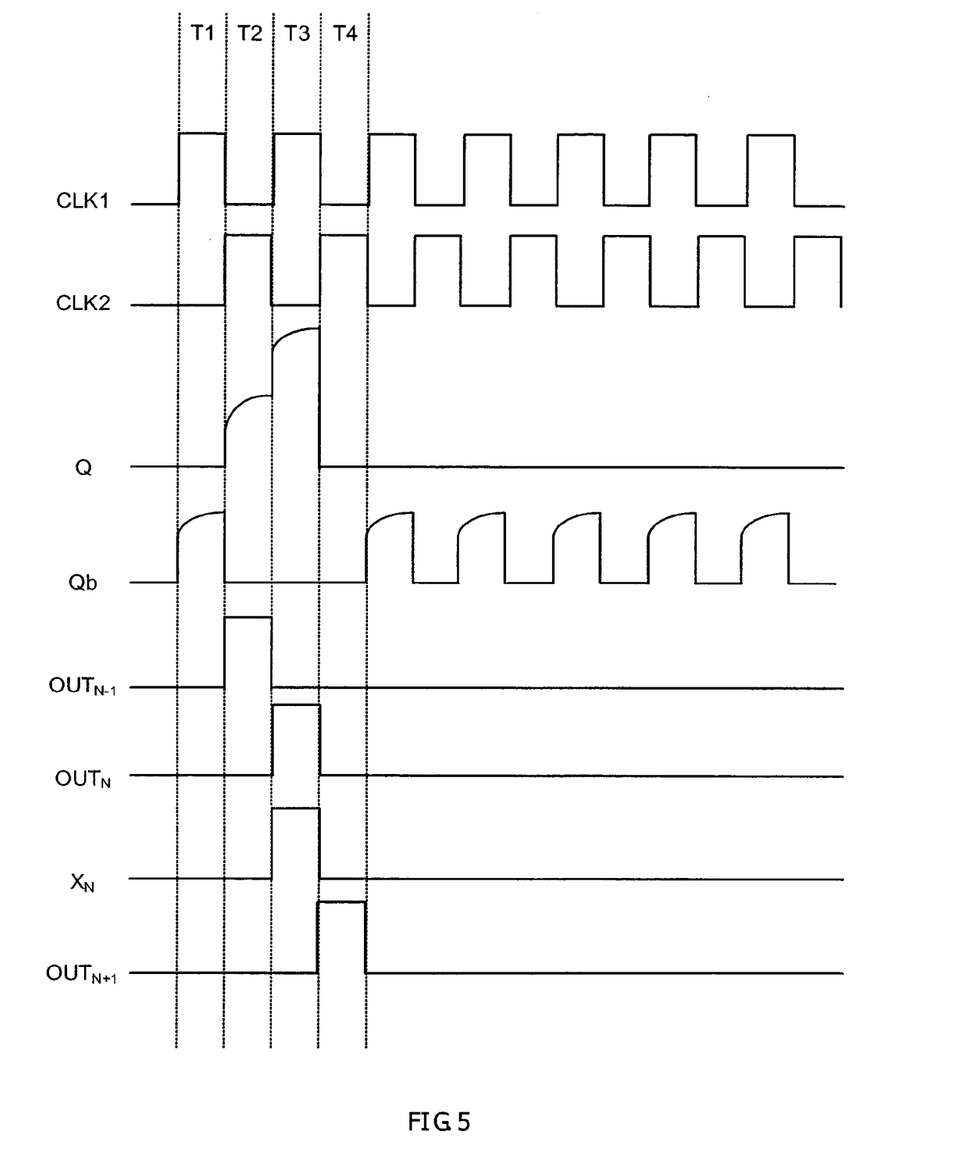
FIG. 5 is a timing chart for the operation of the shift register according to the second embodiment of the present invention.

FIG. 5 is a timing chart for the operation of the shift register according to the second embodiment of the present invention. The technical solution of the present embodiment will be further explained with respect to the operation process of the shift register with reference to FIGS. 4 and 5.

The operation of the shift register according to the present embodiment is divided into four phases, and the details of the operation for each phase are as follows:

The First Phase T1

In this phase, the first clock signal terminal CLK1 is at high level, and each of the second clock signal terminal CLK2, input terminal $INPUT_{N-1}$ for shift register at previous stage and input terminal $INPUT_{N+1}$ for shift register at next stage are both at low level, thus both of the thirteenth thin film transistor M13 and the fourteenth thin film transistor M14 are in OFF state. Due to the first capacitor C1, the high level at the first clock signal terminal CLK1 changes the second node Qb which serves as a pull-down node to high level momentarily, thus the second thin film transistor M2 and the fourth thin film transistor M4 are turned on, which allows the first node Q serving as a pull-up node as well as the output terminal $OUT_N$ at current stage to be connected to the low level signal terminal VSS so as to be maintained the low level state; the low level at the first node Q puts the first thin film transistor M1, the third thin film transistor M3, the fifth thin film transistor M5 and the fifteenth thin film transistor M15 in OFF state.

The Second Phase T2

When the first phase T1 is completed and comes to this phase, the first clock signal terminal CLK1 changes to low level and the second clock signal terminal CLK2 changes to high level, while input terminal $INPUT_{N-1}$ for shift register at previous stage changes to high level and is used as an initial signal for the shift register at current stage, input terminal $INPUT_{N+1}$ for shift register at next stage is maintained at low level; since both of the second clock signal terminal CLK2 and input terminal $INPUT_{N-1}$ for shift register at previous stage are at high level, the high level outputted from input terminal $INPUT_{N-1}$ for shift register at previous stage changes the first node Q to high level via the thirteenth thin film transistor M13 which is turned on; the high level at the first node Q simultaneously turns on the first thin film transistor M1, the third thin film transistor M3 and the fifteenth thin film transistor M15; the third thin film transistor M3 which has been turned on changes the second node Qb which serves as a pull-down node to low level, and the second thin film transistor M2 and the fourth thin film transistor M4 is in OFF state; although the first thin film transistor M1 and the fifteenth thin film transistor M15 are turned on at this time, since the first clock signal terminal CLK1 is at low level, no output is from the output terminal $OUT_N$ at current stage or control output terminal $X_N$ at current stage.

The Third Phase T3

When the second phase T2 is completed and comes to this phase, the first clock signal terminal CLK1 changes to high level, and the second clock signal terminal CLK2 changes to low level, while both of input terminal $INPUT_{N-1}$ for shift register at previous stage and input terminal $INPUT_{N+1}$ for shift register at next stage are at low level, therefore, both of the thirteenth thin film transistor M13 and the fourteenth thin film transistor M14 are in OFF state; since the fourth capacitor C4 is connected between the gate and the drain of the first thin film transistor M1, with the high level of the first clock signal terminal CLK1, the voltage on the first node Q at high level rises to an even higher level as a result of bootstrap effect, and the first thin film transistor M1, the third thin film transistor M3 and the fifteenth thin film transistor M15 are still maintained in ON state; in this phase, although the high level at the first clock signal terminal CLK1 tends to changing the second node Qb to high level via the first capacitor C1, since the third thin film transistor M3 is turned on, the second node Qb which serves as a pull-down node is connected to the low level signal terminal VSS, therefore, the second node Qb is pulled down to the low level, thus the second thin film transistor M2 and the fourth thin film transistor M4 are in OFF state; since the first thin film transistor M1 is turned on, the high level at the first clock signal terminal CLK1 is outputted from output terminal $OUT_N$ at current stage through the first thin film transistor M1, and the output terminal $OUT_N$ at current stage at high level drives the gate on the Nth row of liquid crystal display; since the fifteen thin film transistor M15 is turned on, the high level at the first clock signal terminal CLK1 is outputted from control output terminal $X_N$ at current stage through the fifteen thin film transistor M15, thus a reset signal is outputted to the shift register at previous stage and a start signal is outputted to the shift register at next stage.

The Fourth Phase T4

When the third phase T3 is completed and comes to this phase, the first clock signal terminal CLK1 is in low level state and the second terminal CLK2 is in high level state, while input terminal $INPUT_{N-1}$ for shift register at previous stage is at low level and input terminal $INPUT_{N+1}$ for shift register at next stage is at high level; since the second clock signal terminal CLK2 and input terminal $INPUT_{N+1}$ for shift register at next stage are at high level, the thirteenth thin film transistor M13 and the fourteenth thin film transistor M14 is simultaneously in ON state, thus the first node Q changes to low level; since both of the first node Q and the second node Qb are at low level, the first thin film transistor M1, the second thin film transistor M2, the third thin film transistor M3, the fourth thin film transistor M4 and the fifteenth thin film transistor M15 are all in OFF state; and since the first clock terminal CLK1 is at low level, output terminal $OUT_N$ at current stage is at high level, thus the fifth thin film transistor M5 is in ON state, and the output terminal $OUT_N$ at current stage discharges to the first clock signal terminal CLK1 through the fifth thin film transistor M5 until the output terminal $OUT_N$ at current stage changes to low level which turns off the fifth thin film transistor M5. Then, no matter how the first clock signal terminal CLK1 and the second clock signal terminal CLK2 changes, the first node Q is always kept at low level and maintains the low level of output terminal $OUT_N$ at current stage. At the same time, via the first capacitor C1, the level at the second node Qb is kept consistent with the level of the first clock signal terminal CLK1, that is, when the first clock signal terminal CLK1 is at high level, the second node Qb is at the same high level, and when the first clock signal terminal CLK1 is at low level, the second node Qb is at the same low level, until the initial signal of the next frame arrives.

As can be seen from the operation for the shift register according to the present embodiment, in the technical solution of present embodiments, the first thin film transistor M1 is used to provide a high level output for the output terminal $OUT_N$ at current stage; the second thin film transistor M2 is used to maintain the output terminal at current stage at low level; the third thin film transistor M3 is used to maintain the second node Qb which serves as a pull-down node at low level when the first node Q which serves as a pull-up node is at high level; the fourth thin film transistor M4 is used to maintain the first node Q at low level when the second node Qb is at high level, so that the gate of the first thin film transistor M1 is maintained at low level; the fifth thin film transistor M5 which serves as a discharging module is used to discharge, and when the first clock signal terminal CLK1 is at low level and output terminal $OUT_N$ at current stage is at high level, output terminal $OUT_N$ at current stage at high level discharges to the first clock signal terminal CLK1 via the fifth thin film transistor M5 and output terminal at current stage is maintained at low level, also the fifth thin film transistor M5 is used to pull the output terminal $OUT_N$ at current stage down to the low level; the main function of the thirteenth thin film transistor M13 is that when each of the second clock signal terminal CLK2 and input terminal $INPUT_{N-1}$ for shift register at previous stage is at high level, the high level outputted from input terminal $INPUT_{N-1}$ for shift register at previous stage is transmitted to the first node Q which serves as a pull-up node through the thirteenth thin film transistor M13, so that the first node Q is at high level; the fourteenth thin film transistor M14 is used to change the voltage of the first node Q to low level when input terminal $INPUT_{N+1}$ for shift register at next stage outputs high level; the fifteenth thin film transistor M15 is used to transmit an output signal as the reset signal for the shift register at previous stage, to the shift register at previous stage, and to transmit an output signal as the initial signal for the shift register at next stage, to the shift register at next stage, through the drain of the fifteenth thin film transistor M15; the first capacitor C1 is used to changes the second node Qb to high level via the first capacitor C1 when the first clock signal changes to high level, thus the second thin film transistor M2 and the fourth thin film transistor M4 are turned on, and the first node Q and the output terminal $OUT_N$ at current stage are maintained at low level; the fourth capacitor C4 is used to maintain the first node Q at high level with the bootstrap effect.

In the technical solution for the shift register according to the present embodiment, output terminal $OUT_N$ at current stage of the shift register outputs a gate driving signal, so as to drive a corresponding gate line in the liquid crystal display. At the same time, output signal is received from other two shift registers; wherein, one of the output signals which is from the shift register at previous stage is used as the initial signal for the shift register at current stage, and the other of the output signals which is from the shift register at next stage is used as the reset signal for the shift register at current stage. The operation of the shift register is simultaneously controlled by two clock signals, one output signal which is from the shift register at previous stage and one output signal which is from the shift register at next stage. Instead of the direct current power supply, the shift register according to an embodiment of the present invention only employs the clock signal for driving, thus the power consumption can be greatly reduced. The shift register according to the present embodiment reduces the period during which the second node Qb is at high level. In particularly, the period during which the second node Qb, which serves as a pull-up node, is at high level is reduced to a half of original period, that is, the period during which the high level is applied to the gate of the second thin film transistor M2 is reduced, thus the shifting of the threshold voltage of the second thin film transistor M2 is reduced. The shift register according to the present embodiment employs the second thin film transistor M2 and the fifth thin film transistor M5 to collectively maintain the low level of the output terminal $OUT_N$ at current stage. In this way, the operation time for the second thin film transistor M2 can be greatly reduced, and the drifting of the threshold voltage of the second thin film transistor M2 can be further reduced. Wherein, the duty ratio of the bias voltage for the gate of the second thin film transistor M2 is about 50%, and when the duty ratio of the bias voltage for the gate of thin film transistor is small, the threshold voltage thereof can be recovered slowly and will not be increased with the increase of the period during which high level is applied. Therefore, the damage to thin film transistor is mitigated and the life span of thin film transistor is extended. Also, instead of a direct current driving manner, the voltage of the second node Qb of the present embodiment employs a capacitor driving manner in which the first clock signal terminal CLK1 and the first capacitor C1 are used to drive the voltage of the second node Qb, thereby, the second thin film transistor M2 and the fourth thin film transistor M4 are driven only by electric charge. Using electric charge to turn on the thin film transistor can not only decrease the power consumption, but also reduce the damage to the thin film transistor as well. The present embodiment also provides a discharging module configured with thin film transistor, and thin film transistor will be put into operation only when the output terminal $OUT_N$ at current stage is at high level and the first clock signal terminal CLK1 is at low level. Thus the characteristic of thin film transistor can be well maintained, and the life span of thin film transistor can be greatly extended. Furthermore, the shift register according to the present embodiment is provide with two output terminals at current stage, one of which is responsible for outputting a gate driving signal so as to drive the corresponding gate line in the liquid crystal display, and the other of which employs a separate thin film transistor and is responsible for outputting an output signal as a reset signal of the shift register at previous stage to the shift register at previous stage, and outputting an output signal as an initial signal of the shift register at next stage to the shift register at next stage, thus the defects that one output terminal will cause R/W errors of the shift registers at next stages due to delay can be avoided, thus the operation stability is improved. Therefore, the technical solution according to the present embodiment is particularly applicable to the gate drivers that includes a plurality of shift registers and can avoid R/W errors of the shift registers at next stages. In the present embodiment, the thin film transistor is provided with a gate biasing only when the output terminal $OUT_N$ at current stage outputs high level, whereas throughout the operation of the shift register, the period during which the output terminal $OUT_N$ at current stage outputs a high level is very short, thus no substantial influence is made on the drifting of the threshold voltage of thin film transistor, and it can be guaranteed that the thin film transistor can operate for a long time without deterioration. To sum up, the present invention has the advantages of low cost, low power consumption and long life-span, and has the features of high stability and small delay and the like as well.

Figure 6:
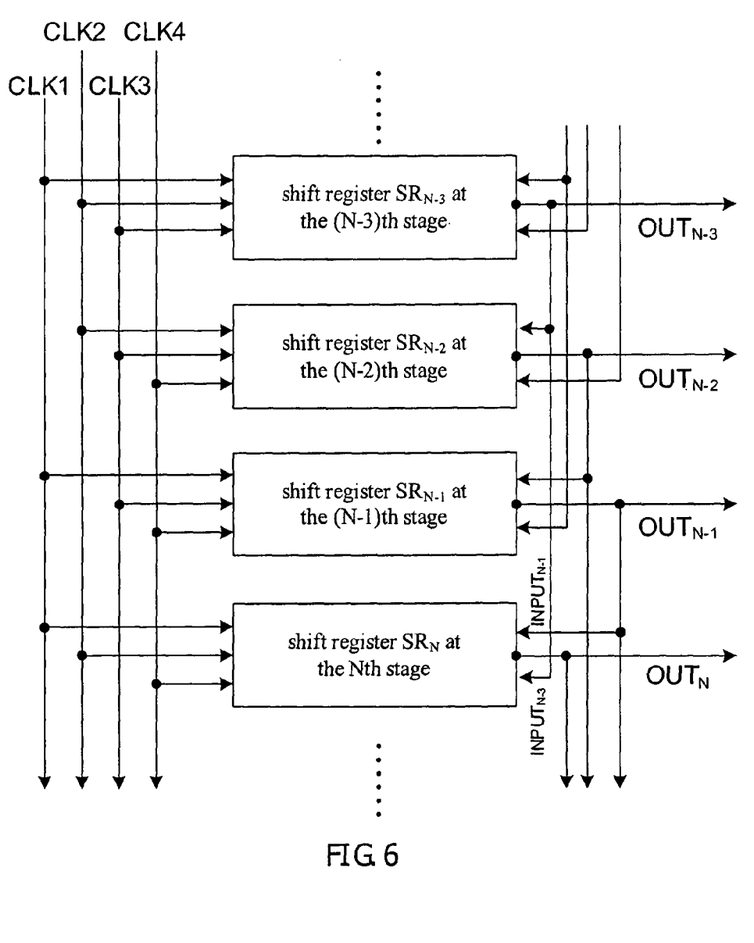
FIG. 6 is a structural schematic diagram of the first gate driver according to an embodiment of the present invention.

The first gate driver according to an embodiment of the present invention comprises a plurality of serially connected shift registers, and four serially connected shift registers constitutes a shift register group. Each of the shift registers respectively comprises: clock signal terminals for receiving three clock signal; the output terminal at current stage, for transmitting gate driving signals to the corresponding gate line; input terminal for shift register at previous stage, for receiving an output signal as the start signal for the shift register at current stage, from the shift register at previous stage; and an input terminal for shift register at third previous stage, for receiving an output signal as the compensation signal for the shift register at current stage, from the shift register at the third previous stage. In addition, each of the shift registers is connected to the low level signal terminal.

FIG. 6 is a structural schematic diagram of the first gate driver according to an embodiment of the present invention. Four shift registers of the shift register group are the shift register $SR_{N-3}$ at the (N−3)th stage, the shift register $SR_{N-2}$ at the (N−2)th stage, the shift register $SR_{N-1}$ at the (N−1)th stage and the shift register $SR_N$ at the Nth stage respectively, each of which has a structure as shown in FIG. 2. In the gate driver according to the present embodiment, the clock signal generator generates four mutual conservative clock signals which are provided to the first clock signal terminal CLK1, the second clock signal terminal CLK2, the third clock signal terminal CLK3 and the fourth clock signal terminal CLK4 respectively. In addition, each of the shift registers is connected to three of these four clock signal terminals in a certain order.

Taking the shift register $SR_N$ at the Nth stage as an example, the I/O terminals thereof are particularly as follows: the first clock signal terminal CLK1; the second clock signal terminal CLK2; the fourth clock signal terminal CLK4; output terminal $OUT_N$ at current stage; input terminal $INPUT_{N-1}$ for shift register at previous stage, for receiving an signal outputted from output terminal $OUT_{N-1}$ of shift register at (N−1)th stage; an input terminal $INPUT_{N-3}$ for shift register at third previous stage, for receiving an signal outputted from output terminal $OUT_{N-3}$ of shift register at (N−3)th stage. In addition, output terminal $OUT_N$ at current stage also outputs an output signal as the initial signal thereof to the shift register at next stage (the (N+1)th stage), and outputs an output signal as the compensation signal thereof to the shift register at third next stage (the (N+3) stage).

The operation process for the first gate driver according to an embodiment of the present invention has been explained in details with reference to the shift register according to the first embodiment of the present invention, and the description thereof is omitted herein.

Figure 7:
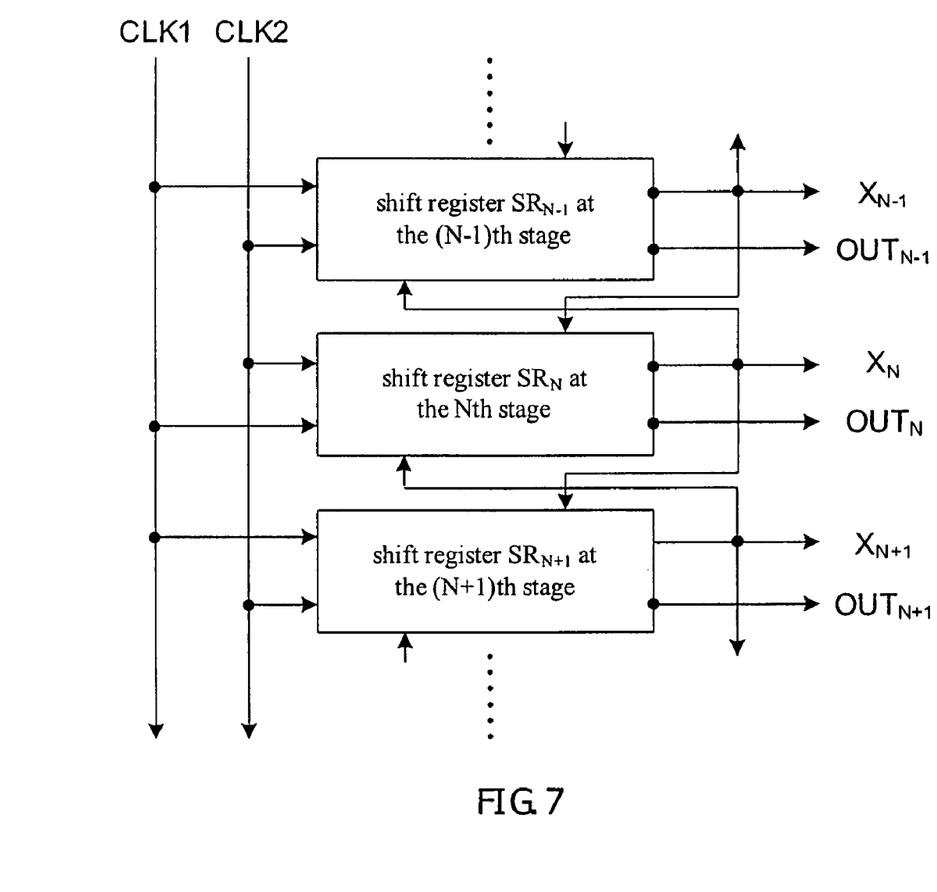
FIG. 7 is a structural schematic diagram of the second gate driver according to an embodiment of the present invention.

The second gate driver according to an embodiment of the present invention comprises a plurality of serially connected shift registers, each of which respectively comprises: clock signal terminals for receiving two clock signals; an output terminal at current stage, for transmitting gate driving signals to the corresponding gate line; an control output terminal at current stage, for outputting a signal to the shift register at previous stage and the shift register at next stage; input terminal for shift register at previous stage, for receiving an output signal as the start signal for the shift register at current stage, from the shift register at previous stage; and an input terminal for shift register at next stage, for receiving an output signal as the reset signal for the shift register at current stage, from the shift register at next stage. In addition, each of these shift registers is connected to the low level signal terminal.

FIG. 7 is a structural schematic diagram of the second gate driver according to an embodiment of the present invention, which includes the shift register $SR_{N-1}$ at the (N−1)th stage, the shift register $SR_N$ at the Nth stage, and the shift register $SR_{N+1}$ at the (N+1)th stage, each of which has a structure as shown in FIG. 4. In the gate driver according to the present embodiment, the clock signal generator generates two mutual conservative clock signals which are provided to the first clock signal terminal CLK1 and the second clock signal terminal CLK2 respectively; wherein, the second clock signal is the inverse signal of the first clock signal.

Taking the shift register $SR_N$ at the Nth stage as example, the I/O terminals thereof are particularly as follows: the first clock signal terminal CLK1; the second clock signal terminal CLK2; control output terminal $X_N$ at current stage; input terminal $INPUT_{N-1}$ for shift register at previous stage, for receiving an signal outputted from output terminal $OUT_{N-1}$ of shift register at (N−1)th stage; an input terminal $INPUT_{N+1}$ for shift register at next stage, for receiving an signal outputted from output terminal $OUT_{N+1}$ of shift register at (N+1)th stage. In addition, control output terminal $X_N$ at current stage output an output signal as the initial signal thereof to the shift register at next stage (the N+1)th stage), and output an output signal as the reset signal thereof to the shift register at previous stage (the (N−1) stage).

The operation for the second gate driver according to an embodiment of the present invention has been explained in details with reference to the shift register of the second embodiment according to the present invention, and the description thereof is omitted herein.

Finally, it should be noted that the above embodiments is only for explaining the technical solution of the present invention, and not for limitation. Although the present invention has been described in details with reference to the embodiments, it should be appreciated by those skilled in the art that the technical solution of the present invention can be modified or equivalently replaced without departing from the spirit and scope of the technical solution in the present invention.

What is claimed is:

1. A shift register comprising:
    a first thin film transistor, of which a gate is connected to a first node that serves as a pull-up node, a source is connected to a clock signal terminal, and a drain is connected to an the output terminal at current stage;
    a second thin film transistor, of which a gate is connected to a second node that serves as a pull-down node, a source is connected to the output terminal at current stage, and a drain is connected to a low level signal terminal;
    a third thin film transistor, of which a gate is connected to the first node, a source is connected to the low level signal terminal, and a drain is connected to the second node;
    a fourth thin film transistor, of which a gate is connected to the second node, a source is connected to the low level signal terminal, and a drain is connected to the first node;
    a first capacitor connected between the clock signal terminal and the second node, for changing the second node into high level when the clock signal terminal is at high level;
    a discharging module connected between the clock signal terminal and the output terminal at current stage, for causing the output terminal at current stage to discharge to the clock signal terminal when the output terminal at current stage is at high level and the clock signal terminal is at low level; and
    a compensation module connected between the first node and the low level signal terminal, for providing compensation and compensation protection for the first node, so as to change the second node into high level or low level correspondingly, according to the high level or low level of the clock signal.

2. The shift register according to the claim 1, wherein said discharging module is a thin film transistor, of which a gate and a source are both connected to the output terminal at current stage, and a drain is connected to the clock signal terminal.

3. The shift register according to the claim 1, wherein said compensation module comprises:
    a sixth thin film transistor, of which a gate is connected to an input terminal for a shift register at third previous stage, a source is connected to another clock signal terminal, and a drain is connected to the first node;
    a seventh thin film transistor, of which a gate is connected to said another clock signal terminal, a source is connected to one terminal of a second capacitor, and a drain is connected to the low level signal terminal, while the other terminal of the second capacitor is connected to the first node;

an eighth thin film transistor, of which a gate and a source are both connected to an input terminal for a shift register at previous stage, and a drain is connected to the source of the seventh thin film transistor;

a ninth thin film transistor, of which a gate is connected to a still another clock signal terminal, a drain is connected to the first node;

a tenth thin film transistor, of which a gate is connected to the first node, a drain is connected to the output terminal at current stage, and a source is connected to the source of the ninth thin film transistor;

an eleventh thin film transistor, of which a gate is connected to one terminal of a third capacitor, a drain is connected to the first node, and a drain is connected to the low level signal terminal, while the other terminal of the third capacitor is connected to said another clock signal terminal; and a twelfth thin film transistor, of which a gate is connected to the input terminal for a shift register at third previous stage, a drain is connected to the gate of the eleventh thin film transistor, and a source is connected to the low level signal terminal.

4. The shift register according to the claim 2, wherein said compensation module comprises:

a sixth thin film transistor, of which a gate is connected to an input terminal for a shift register at third previous stage, a source is connected to another clock signal terminal, and a drain is connected to the first node;

a seventh thin film transistor, of which a gate is connected to said another clock signal terminal, a source is connected to one terminal of a second capacitor, and a drain is connected to the low level signal terminal, while the other terminal of the second capacitor is connected to the first node;

an eighth thin film transistor, of which a gate and a source are both connected to an input terminal for a shift register at previous stage, and a drain is connected to the source of the seventh thin film transistor;

a ninth thin film transistor, of which a gate is connected to a still another clock signal terminal, a drain is connected to the first node;

a tenth thin film transistor, of which a gate is connected to the first node, a drain is connected to the output terminal at current stage, and a source is connected to the source of the ninth thin film transistor;

an eleventh thin film transistor, of which a gate is connected to one terminal of a third capacitor, a drain is connected to the first node, and a drain is connected to the low level signal terminal, while the other terminal of the third capacitor is connected to said another clock signal terminal; and a twelfth thin film transistor, of which a gate is connected to the input terminal for a shift register at third previous stage, a drain is connected to the gate of the eleventh thin film transistor, and a source is connected to the low level signal terminal.

5. The shift register according to the claim 1, wherein said compensation module comprises:

a thirteenth thin film transistor, of which a gate is connected to another clock signal terminal, a source is connected to an input terminal for a shift register at previous stage, and a drain is connected to the first node;

a fourteenth thin film transistor, of which a gate is connected to an input terminal for a shift register at next stage, a source is connected to the first node, and the drain is connected to the low level signal terminal;

a fifteenth thin film transistor, of which a gate is connected to the first node, a source is connected to said clock signal terminal, and a drain serves as a control out terminal at current stage which transmits output signal to shift register at previous stage and shift register at next stage, respectively; and a fourth capacitor connected between the gate and the source of the first thin film transistor.

6. The shift register according to the claim 2, wherein said compensation module comprises:

a thirteenth thin film transistor, of which a gate is connected to another clock signal terminal, a source is connected to an input terminal for a shift register at previous stage, and a drain is connected to the first node;

a fourteenth thin film transistor, of which a gate is connected to an input terminal for a shift register at next stage, a source is connected to the first node, and the drain is connected to the low level signal terminal;

a fifteenth thin film transistor, of which a gate is connected to the first node, a source is connected to said clock signal terminal, and a drain serves as a control out terminal at current stage which transmits output signal to shift register at previous stage and shift register at next stage, respectively; and a fourth capacitor connected between the gate and the source of the first thin film transistor.

7. A gate driver employing the shift register according to the claim 1, which includes a plurality of shift registers connected in series, wherein said shift register has: three clock signal terminals; an output terminal at current stage; an input terminal for shift register at previous stage, for receiving an output signal from the shift register at previous stage; and an input terminal for shift register at a third previous stage, for receiving an output signal from the shift register at third previous stage.

8. The gate driver according to the claim 7, wherein said discharging module is a thin film transistor, of which a gate and a source are both connected to the output terminal at current stage, and a drain is connected to the clock signal terminal.

9. The gate driver according to the claim 7, wherein said compensation module comprises:

a sixth thin film transistor, of which a gate is connected to an input terminal for a shift register at third previous stage, a source is connected to another clock signal terminal, and a drain is connected to the first node;

a seventh thin film transistor, of which a gate is connected to said another clock signal terminal, a source is connected to one terminal of a second capacitor, and a drain is connected to the low level signal terminal, while the other terminal of the second capacitor is connected to the first node;

an eighth thin film transistor, of which a gate and a source are both connected to an input terminal for a shift register at previous stage, and a drain is connected to the source of the seventh thin film transistor;

a ninth thin film transistor, of which a gate is connected to a still another clock signal terminal, a drain is connected to the first node;

a tenth thin film transistor, of which a gate is connected to the first node, a drain is connected to the output terminal at current stage, and a source is connected to the source of the ninth thin film transistor;

an eleventh thin film transistor, of which a gate is connected to one terminal of a third capacitor, a drain is connected to the first node, and a drain is connected to the low level signal terminal, while the other terminal of the third capacitor is connected to said another clock signal terminal; and a twelfth thin film transistor, of which a gate is connected to the input terminal for a shift register at third previous stage, a drain is connected to the gate of the eleventh thin film transistor, and a source is connected to the low level signal terminal.

10. The gate driver according to the claim 8, wherein said compensation module comprises:

a sixth thin film transistor, of which a gate is connected to an input terminal for a shift register at third previous stage, a source is connected to another clock signal terminal, and a drain is connected to the first node;

a seventh thin film transistor, of which a gate is connected to said another clock signal terminal, a source is connected to one terminal of a second capacitor, and a drain is connected to the low level signal terminal, while the other terminal of the second capacitor is connected to the first node;

an eighth thin film transistor, of which a gate and a source are both connected to an input terminal for a shift register at previous stage, and a drain is connected to the source of the seventh thin film transistor;

a ninth thin film transistor, of which a gate is connected to a still another clock signal terminal, a drain is connected to the first node;

a tenth thin film transistor, of which a gate is connected to the first node, a drain is connected to the output terminal at current stage, and a source is connected to the source of the ninth thin film transistor;

an eleventh thin film transistor, of which a gate is connected to one terminal of a third capacitor, a drain is connected to the first node, and a drain is connected to the low level signal terminal, while the other terminal of the third capacitor is connected to said another clock signal terminal; and a twelfth thin film transistor, of which a gate is connected to the input terminal for a shift register at third previous stage, a drain is connected to the gate of the eleventh thin film transistor, and a source is connected to the low level signal terminal.

11. A gate driver employing the shift register according to the claim 1, which includes a plurality of shift registers connected in series, wherein said shift register has: two clock signal terminals; an output terminal at current stage; a control output terminal at the current stage; an input terminal for shift register at previous stage, for receiving an output signal from the shift register at previous stage; an input terminal for shift register at next stage, for receiving an output signal from the shift register at next stage; wherein said output terminal at current stage outputs a gate driving signal so as to drive the respective gate lines for liquid crystal display, and said control output terminal at the current stage outputs a control signal to the shift register at previous stage and the shift register at next stage.

12. The gate driver according to the claim 11, wherein said discharging module is a thin film transistor, of which a gate and a source are both connected to the output terminal at current stage, and a drain is connected to the clock signal terminal.

13. The gate driver according to the claim 11, wherein said compensation module comprises:

a thirteenth thin film transistor, of which a gate is connected to another clock signal terminal, a source is connected to an input terminal for a shift register at previous stage, and a drain is connected to the first node;

a fourteenth thin film transistor, of which a gate is connected to an input terminal for a shift register at next stage, a source is connected to the first node, and the drain is connected to the low level signal terminal;

a fifteenth thin film transistor, of which a gate is connected to the first node, a source is connected to said clock signal terminal, and a drain serves as a control out terminal at current stage which transmits output signal to shift register at previous stage and shift register at next stage, respectively; and a fourth capacitor connected between the gate and the source of the first thin film transistor.

14. The gate driver according to the claim 12, wherein said compensation module comprises:

a thirteenth thin film transistor, of which a gate is connected to another clock signal terminal, a source is connected to an input terminal for a shift register at previous stage, and a drain is connected to the first node;

a fourteenth thin film transistor, of which a gate is connected to an input terminal for a shift register at next stage, a source is connected to the first node, and the drain is connected to the low level signal terminal;

a fifteenth thin film transistor, of which a gate is connected to the first node, a source is connected to said clock signal terminal, and a drain serves as a control out terminal at current stage which transmits output signal to shift register at previous stage and shift register at next stage, respectively; and a fourth capacitor connected between the gate and the source of the first thin film transistor.

* * * * *